(12) United States Patent
Yung

(10) Patent No.: US 6,603,344 B2
(45) Date of Patent: Aug. 5, 2003

(54) ZERO STATIC POWER PROGRAMMABLE FUSE CELL FOR INTEGRATED CIRCUITS

(75) Inventor: Ma Fan Yung, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/905,208

(22) Filed: Jul. 11, 2001

(65) Prior Publication Data

US 2003/0016074 A1 Jan. 23, 2003

(51) Int. Cl.$^7$ .............................................. H01H 37/76
(52) U.S. Cl. ..................... 327/525; 365/185.3
(58) Field of Search ................. 327/526, 525, 327/524; 365/185.3, 225.7

(56) References Cited

U.S. PATENT DOCUMENTS

| | | | |
|---|---|---|---|
| 4,546,455 A | 10/1985 | Iwahashi et al. ............. | 365/200 |
| 4,922,134 A | 5/1990 | Hoffmann et al. ............ | 326/13 |
| 5,345,110 A | 9/1994 | Renfro et al. ................ | 327/199 |
| 6,087,890 A * | 7/2000 | Kim ............................ | 327/526 |
| 6,201,750 B1 | 3/2001 | Busch et al. ................. | 356/634 |
| 6,256,239 B1 | 7/2001 | Akita et al. .................. | 365/200 |
| 6,281,739 B1 | 8/2001 | Matsui ........................ | 327/525 |
| 6,404,680 B1 * | 6/2002 | Kwon ....................... | 365/185.3 |

FOREIGN PATENT DOCUMENTS

| | | |
|---|---|---|
| EP | 0 528 744 A3 | 2/1993 |
| EP | 0 528 744 A2 | 2/1993 |
| EP | 0 947 993 A2 | 10/1999 |
| EP | 0 947 993 A3 | 6/2000 |
| JP | 58105497 | 6/1983 |
| JP | 2000021191 | 1/2000 |

* cited by examiner

Primary Examiner—Dinh T. Le
(74) Attorney, Agent, or Firm—Dexter Chin

(57) ABSTRACT

A software programmable fuse cell which reduces or eliminates static power consumption is disclosed. The programmable fuse cell includes programmable and non-programmable operating modes. Depending on the operating mode, the fuse cell output is determined by the actual state of the fuse or which fuse state the fuse cell is simulating. To reduce static power consumption, a latch is used to store the actual or simulated fuse state.

21 Claims, 6 Drawing Sheets

US 6,603,344 B2

ZERO STATIC POWER PROGRAMMABLE FUSE CELL FOR INTEGRATED CIRCUITS

FIELD OF THE INVENTION

The present invention relates generally to integrated circuits (ICs). More particularly, the invention relates to fuses used in ICs.

BACKGROUND OF THE INVENTION

Fuse cells are widely used in integrated circuits. As an example, fuse cells can be used to store addressing information of defective memory cells in an array for redundancy applications. FIG. 1 shows a conventional fuse cell 101. The fuse cell typically includes a fuse 110 coupled between a pull-up circuit 105 (e.g., $V_{cc}$ which represents a logic 1) and a pull-down circuit 106 (e.g., ground which represents a logic 0). Depending on the state of the fuse (cut or uncut), the fuse cell generates a fuse cell output signal at a fuse cell output terminal 160 which is commonly coupled to the fuse and pull-up power source. As illustrated, the pull-down circuit is decoupled from the power-up circuit when the fuse is cut, producing a logic 1 fuse cell output signal. On the other hand, an uncut fuse couples the output terminal to the pull-down circuit, thus generating a logic 0 output signal.

In the event the fuse is uncut, a current path exists between the power up and power-down circuits. As a result, power dissipates from the power up circuit to ground when the fuse is uncut. This leads to an increase in power consumption, particularly since one of the design goals is to minimize the need to cut fuses in the IC. For low power or portable applications, particularly, the increased power consumption is undesirable and, in some cases, unacceptable.

As evidenced from the above discussion, it is desirable to provide an improved fuse cell with reduced or no static power dissipation.

SUMMARY OF THE INVENTION

The invention relates generally to fuse cells. In particular, the invention relates to software programmable fuses having reduced or no static power consumption. In one embodiment, the fuse cell includes a control circuit, a fuse circuit, a software fuse circuit, and a latch. The control circuit is coupled to the latch, fuse circuit and software fuse circuit. In response to fuse cell input signals, the control circuit causes the fuse cell to operate in either a first or second operating mode. In the first operating mode, the control circuit couples the latch to the fuse circuit, enabling the latch to store the fuse state. In the second operating mode, the control circuit couples the latch to the software fuse circuit. Depending on the fuse state to be simulated, the latch is in a first logic state or a second logic state.

In another embodiment, the control circuit further comprises an initialization circuit. During power up, for example, an active initialization signal is generated. The active initialization signal couples the initialization circuit to the latch to initialize the latch to a first known state. After the latch has been initialized, the fuse cell operates in either the first or second operating mode.

PREFERRED EMBODIMENTS OF THE INVENTION

Figure 1:
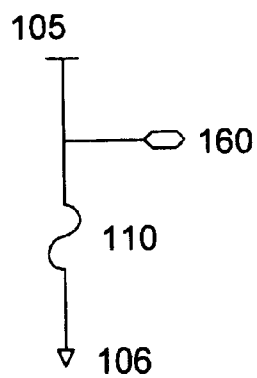
FIG. 1 shows a conventional fuse cell.
Figure 2:
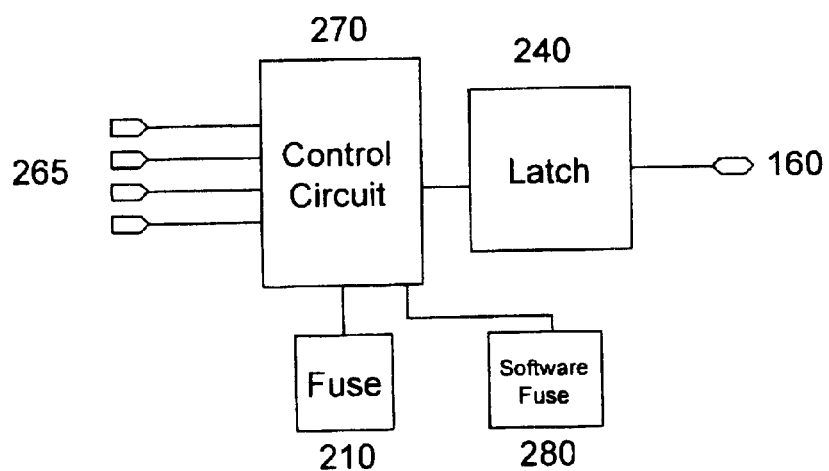
FIGS. 2–7 show fuse cells in accordance with various embodiments of the invention.

FIG. 2 shows a block diagram of a software programmable fuse cell 201 in accordance with one embodiment of the invention. The software programmable fuse cell comprises input terminals 265 for receiving control input signals, an output terminal 160, a control circuit 270, a fuse circuit 210, a software fusing circuit 280, and a latch 240. The input terminals are coupled to the control circuit and the output terminal is coupled to the latch. The latch, fuse circuit, and software fusing circuit are coupled to the control circuit.

In one embodiment, the control circuit includes an initialization circuit which sets the latch to a known first state (e.g., a logic 1) when activated, such as during system power up. When the fuse cell is initialized, the fuse and software programmable fuse circuitry can be decoupled from the latch. After the fuse has been initialized, the fuse can operate in first or second operating modes (programmable or non-programmable) as determined by the control input signals.

Generally, the initialization circuit is decoupled from the latch when the fuse cell is operating in either the programmable or non-programmable mode. In the non-programmable mode, the fuse is coupled to the latch. The latch either remains in the first known state or switches to a second state, depending on whether the fuse is cut or uncut. In one embodiment, a cut fuse causes the latch to remain in the first state (e.g., logic 1) while an uncut fuse switches the latch to the second state (e.g., logic 0). When the fuse is operating in the programmable mode, the software fuse circuitry is activated to simulate either a cut or an uncut fuse state. The software programmable fuse circuitry, for example, causes the latch to remain in the first state when simulating a cut fuse and switches to the second state when simulating an uncut fuse. The latch is selectively switched between first and second states depending on the fuse state to be simulated.

In one embodiment, the initialization circuit can be used to simulate the fuse state indicated by the latch being in the first state (e.g., simulating a cut fuse state) while the software fuse circuitry can be coupled to the latch to switch the latch from the first to the second state to simulate the fuse state indicated by the latch being in the second state (e.g., simulating an uncut fuse state). Such application takes advantage of the existing initialization circuitry in the programmable mode. Alternatively, the software programmable fuse circuitry can selectively switch the latch between first and second states depending on the fuse state to be simulated.

Figure 3:
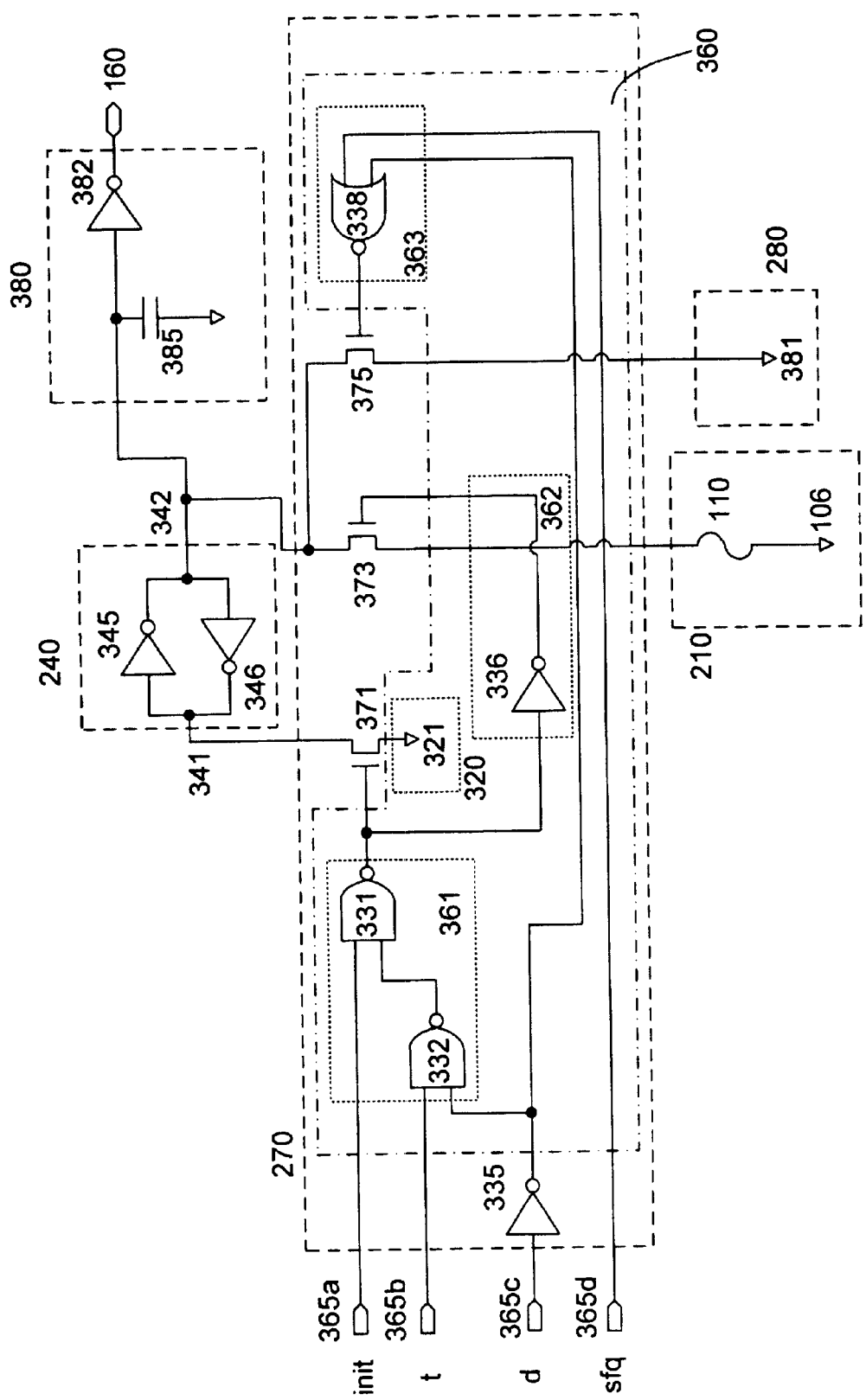

FIG. 3 shows a software programmable fuse cell in accordance with one embodiment of the invention. The fuse cell comprises input terminals 365a–d for receiving input control signals, an output terminal 160, a control circuit 270, a fuse circuit 210, a software programmable fuse circuitry 280, and a latch 240. The input terminals are coupled to the control circuit and the output terminal is coupled to the latch. The latch, fuse circuit, and software programmable fuse circuitry are coupled to the control circuit.

As shown in FIG. 3, the latch includes first (input) and second (output) latch terminals 341 and 342 commonly coupled to first and second inverters 345 and 346 back-to-back. Other types of latches are also useful. The first and second latch terminals are coupled to the control circuit.

The control circuit comprises first, second, and third switch transistors 371, 373, and 375. The switch transistors selectively couple and decouple the initialization, fuse, and software programmable fuse circuits 320, 210, and 280 to the latch depending on the mode of operation. The switch transistors, for example, are n-FETs. Other types of transistors, such as p-FETs or a combination of n-FETs and p-FETs are also useful. The transistors are switched on or off (conductive or non-conductive) to couple or decouple the respective circuits to the latch.

In one embodiment, the first transistor couples the initialization circuit to the first latch terminal and the second and third transistors respectively couple the fuse and software programmable circuits to the second latch terminal. The initialization and software programmable fuse circuits each comprises a pull-down circuit (321 or 381) and the fuse circuit comprises a fuse 110 coupled to a pull-down circuit 106. A ground or a logic 0 can be used to serve as a pull-down circuit.

The switch transistors are selectively switched on or off depending on the mode of operation. Table 1 shows the states of the first, second, and third transistors (T1, T2, and T3) for the different fuse cell modes in accordance with one embodiment of the invention.

TABLE 1

|  | Initialization | Non programmable | Programmable (uncut fuse) | Programmable (cut fuse) |
| --- | --- | --- | --- | --- |
| T1 | on | off | off | on |
| T2 | off | on | on | off |
| T3 | off | off | on | off |

As shown by Table 1, the first transistor is switched on while the second and third transistors are switch off to initialize the fuse cell. This couples the pull-down circuit to the latch, setting the second latch terminal to equal to a logic 1. After initialization, the fuse cell can operate in ether the non-programmable or programmable mode.

In the non-programmable mode, the first and third transistors are switched off and the second transistor is switched on. This decouples the initialization and software programmable fuse circuits from the latch while coupling the fuse circuit to the latch. A cut fuse severs the pull-down circuit from second latch terminal, allowing it to remain in the first logic state. On the other hand, an uncut fuse couples the pull-down circuit to the second latch terminal, pulling it down to a logic 0.

In the programmable mode, the third transistor is switched on or off depending on whether the fuse cell is simulating a cut or an uncut fuse state. To simulate an uncut fuse state, the third transistor is switched on. This couples the pull-down circuit 381 to the latch, causing the second latch terminal to be pull-down to a logic 0. Simulating a cut fuse state is achieved by switching off the third transistor to allow the latch to remain in the first state (logic 1).

In one embodiment, the latch can be switched between the first and second states in the programmable mode by utilizing the initialization and software fuse circuits. The initialization and software fuse circuits operate in the push-pull configuration in the programmable mode. For example, to simulate a cut fuse state, the first transistor is on while the third is off. Simulating an uncut fuse state can be accomplished by switching on the third transistor and switching off the first one.

In one embodiment, the first and second transistors are configured to operate in a push-pull fashion. By operating the first and second transistors in such a manner, either the initialization or fuse circuit is coupled to the latch at one time. This ensures that the first and second latch terminals are not in conflict.

The fuse cell, in one embodiment, receives the following input control signals at the input terminals: initialization (init), mode (t), enable software fuse circuitry (sfq), and simulated fuse state (d). The input signals are provided to a control logic 360 having output terminals respectively coupled to the gates of the transistors. The control logic generates output signals at the output terminals in response to the input signals to control the operation of the transistors in the different operating modes. Table 2 shows the input signals and corresponding operating mode in accordance with one embodiment of the invention.

TABLE 2

|  | Initialization | Non programmable | Programmable (uncut fuse) | Programmable (cut fuse) |
| --- | --- | --- | --- | --- |
|  | T1 = on | T1 = off | T1 = off | T1 = on |
|  | T2 = off | T2 = on | T2 = on | T2 = off |
|  | T3 = off | T3 = off | T3 = on | T3 = off |
| init | active (logic 0) | inactive (logic 1) | inactive (logic 1) | inactive (logic 1) |
| t | don't care | inactive (logic 0) | active (logic 1) | active (logic 1) |
| sfq | inactive (logic 1) | inactive (logic 1) | active (logic 0) | active (logic 0) |
| d | don't care | don't care | inactive (logic 1) | active (logic 0) |

As shown, the input control signals except for t are active low signals. The fuse cell is initialized by providing an active init (logic 0) and an inactive sfq signal (logic 1). Providing inactive init, t, and sfq signals causes the control circuit to operate the fuse cell in the non-programmable mode. To operate the fuse cell in the programmable mode, an inactive init and active sfq and t signals are provided. If a cut fuse is to be simulated in the programmable mode, the d signal is active. On the other hand, an inactive d signal causes the fuse cell to simulate an uncut fuse.

The control circuit includes control logic 360 to perform the desired function specified by the tables. As shown in FIG. 3, the control logic comprises initialization, fuse, and software programmable fuse control circuitry 361, 362, and 363.

In one embodiment, the initialization control circuitry comprises first and second nand gates 331 and 332. The nand gates include first and second input terminals and an output terminal. One input terminal of the first nand gate receives the init signal while the other receives the output signal from the second nand gate which receives the t and inverted d input signals. An inverter 335 is provided to invert the d signal to the second nand gate. The first nand gate's output terminal is coupled to the gate of the first transistor. When the init signal is active (logic 0), the initialization control circuitry generates an active output signal (logic 1) to switch on the first transistor, irrespective of the value of t and d signals. Providing inactive init and t signals causes the initialization control circuitry to generate an inactive (logic 0) output signal, switching off the first transistor. If an active t and inactive init signals are present, the output of the initialization control circuitry will depend on the d signal (e.g., active output signal (logic 1) is generated if d is active and inactive output signal (logic 0) is generated if d is inactive).

The fuse control circuitry comprises an inverter 336 to invert the output of the initialization control block. The output of the inverter is coupled to the gate of the second transistor, thus ensuring that the first and second transistors operate in a push-pull configuration. The software fuse control circuitry comprises a nor gate 338 which receives the sfq and inverted d signals. The output terminal of the nor gate is coupled to the third transistor. When sfq is active, the output of the nor gate depends on the state of the d signal. An inactive d with an active sfq signal cause the nor gate to generate an active (logic 1) output signal to switch on the third transistor; active d and sfq signals cause the nor gate to generate an inactive output signal to switch off the third transistor.

Figure 4:
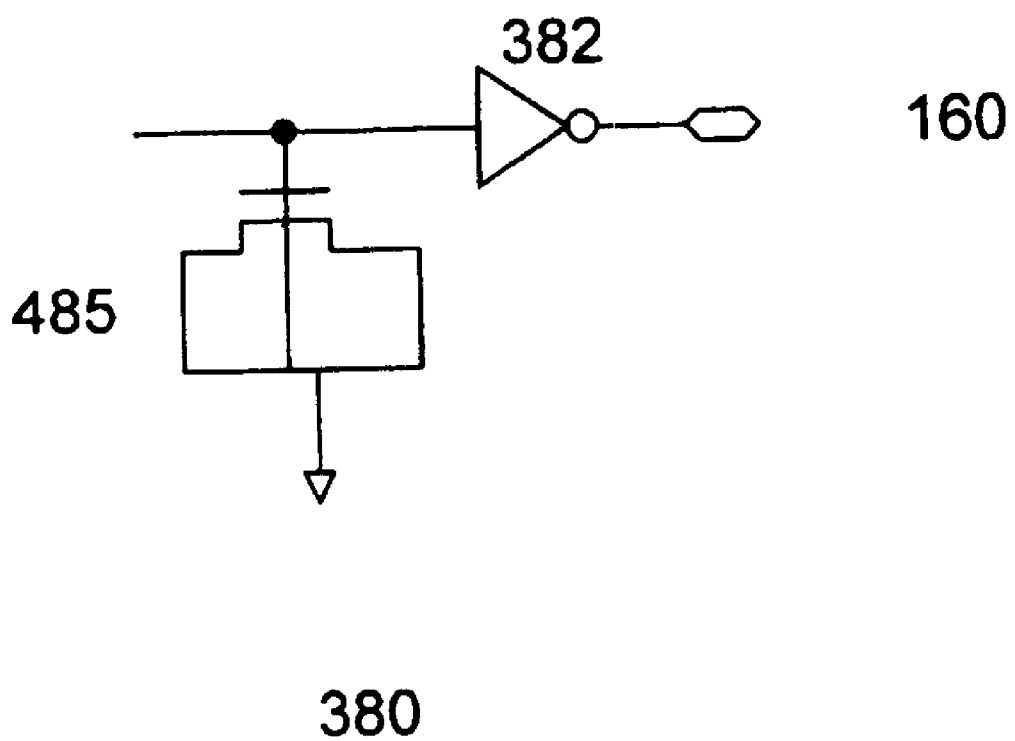

In one embodiment, an output stage 380 is coupled between the second terminal of the latch and fuse cell output terminal. The output stage comprises a capacitor 385 coupled between the output terminal and ground. In an alternative embodiment, as shown in FIG. 4, the capacitor comprises a CMOS capacitor such as a p-FET. The capacitor serves to stabilize the fuse cell output from glitches. An inverter 382 may optionally be provided to switch the logic of the fuse cell output signal.

Figure 5:
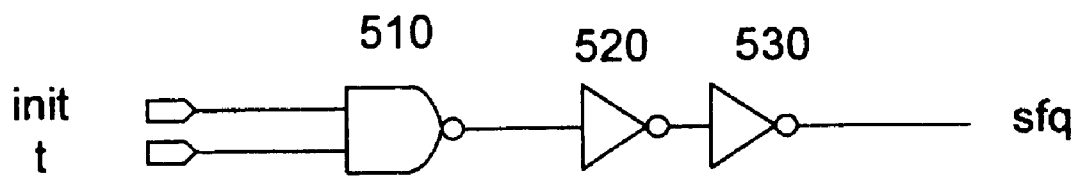

FIG. 5 shows the generation of sfq signal in accordance with one embodiment of the invention. The sfq signal is derived from the init and t signals. In one embodiment, sfq signal is active (logic 0) when init is deactivated (logic 1) and t is activated (logic 1). In one embodiment, the sfq signal is derived by providing the init and t signals to a nand gate 510. First and second inverters may be provided to serve as a buffer for the output of the nand gate.

Figure 6:
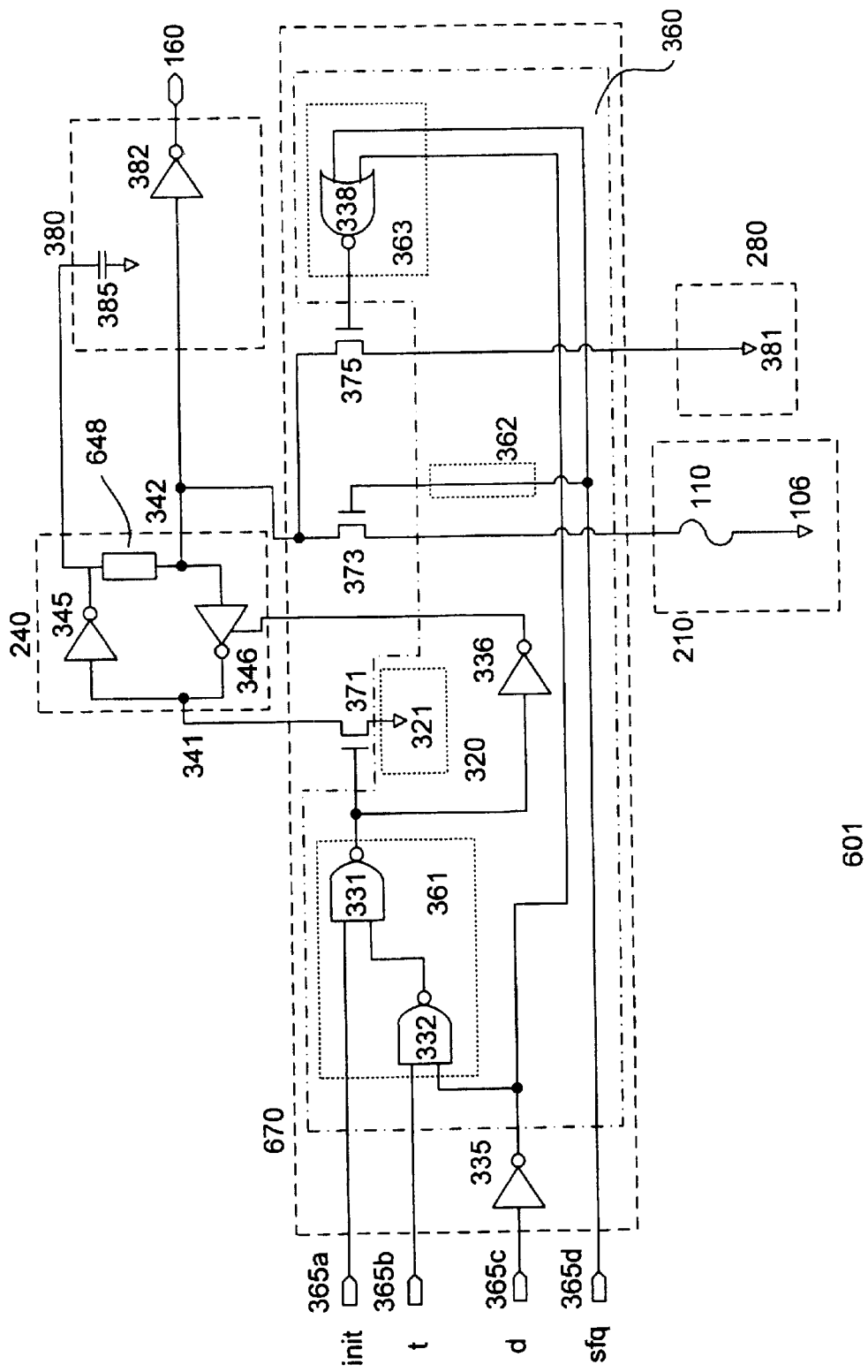

FIG. 6 shows a fuse cell 601 in accordance with another embodiment of the invention. The fuse cell, as shown, provides a valid fuse cell output during initialization. During initialization, either the fuse (non-programmable mode) or software fuse circuit (programmable mode) is coupled to the latch by providing the necessary input control signals (e.g., t, sfq, and d) to the control circuit. The fuse cell output depends on the state of the fuse in the non-programmable mode or the state of the fuse to be simulated in the programmable mode. In one embodiment, the fuse circuit is coupled to the latch during power-up initialization. After initialization, the fuse cell operates in normal operating modes (e.g., programmable or non-programmable) as previously described.

The control circuit 670 is similar to the control circuit 270 of FIG. 3 except that the inverted output signal from the initialization control block 361 is coupled to the enable input of the second latch inverter 346. As a result, the second latch inverter is deactivated during initialization to sever the feed back path between the second and first latch terminals. This prevents potential contention between the latch terminals in the event that the fuse is uncut.

Figure 7:
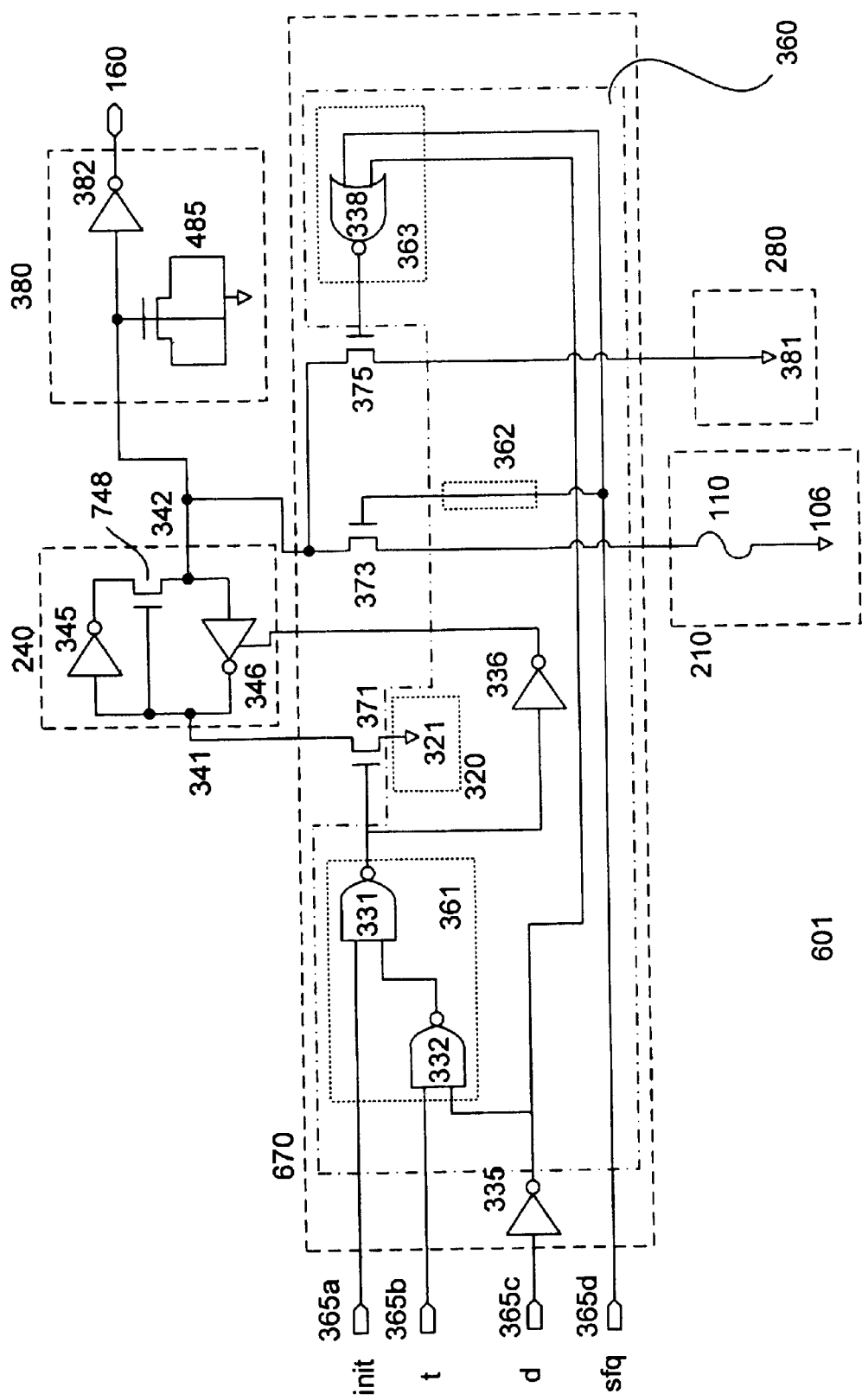

A resistor 648 can be commonly coupled to the inverters (e.g., output terminal of the first inverter and input terminal of the second inverter) and the second latch terminal. The resistor serves to reduce power dissipation during initialization if the fuse is uncut. In an alternative embodiment, the resistor can be implemented using a transistor 748 such as a p-FET, as shown in FIG. 7.

An optional output stage, as described in FIGS. 3 and 4, may be provided between the second terminal of the latch and the fuse cell output terminal. Alternatively, as shown in FIG. 6, one terminal of capacitor is commonly coupled to the resistor and first inverter of the latch while the other terminal is coupled to ground.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A software programmable fuse cell comprising:
   fuse cell input terminals for receiving fuse input control signals;
   a fuse cell output terminal;
   a control circuit coupled to the fuse cell input terminals;
   a fuse circuit coupled to the control circuit, the fuse circuit comprises a fuse having a first or a second fuse state;
   a software programmable fuse circuit coupled to the control circuit;
   a latch coupled to the fuse cell output terminal and the control circuit, the latch having a first or a second latch state causing a fuse output signal at the fuse cell output terminal to have a first or second output state, the first or second output state indicative of the fuse having either the first or second fuse state; and
   in response to the fuse input control signals at the fuse cell input terminals, the control circuit causes the fuse cell to be in an initialization, first or second mode of the fuse cell operation, wherein
   in the initialization mode, the control circuit initializes the latch to the first latch state,
   in the first mode, the control circuit couples the fuse circuit to the latch, causing the latch to be in one of the first or second latch state depending on the fuse state; and
   in the second mode, the control circuit and the software programmable fuse circuit cause the latch to be in the first or second state depending on the input signals.

2. The software programmable fuse cell of claim 1 wherein the control circuit comprises an initialization circuit, the control circuit couples initialization circuit to the latch in the initialization mode.

3. The software programmable fuse cell of claim 2 wherein the initialization circuit comprises an initialization reference voltage.

4. The software programmable fuse cell of claim 3 wherein the initialization reference voltage comprises ground.

5. The software programmable fuse cell of claim 2 wherein:
   the software programmable fuse circuit comprises a software fuse reference voltage; and
   the fuse circuit comprises a fuse reference voltage, the fuse is coupled to the fuse reference voltage in the first fuse state and decoupled from the fuse reference voltage in the second fuse state.

6. The software programmable fuse cell of claim 5 wherein the fuse reference voltage comprises ground.

7. The software programmable fuse cell of claim 5 wherein the software fuse reference voltage comprises ground.

8. The software programmable fuse cell of claim 5 wherein the fuse reference and software fuse reference voltages comprise ground.

9. The software programmable fuse cell of claim 2 wherein:
   the initialization circuit comprises an initialization reference voltage;
   the software programmable fuse circuit comprises a software fuse reference voltage; and
   the fuse circuit comprises a fuse reference voltage, the fuse is coupled to the fuse reference voltage in the first fuse state and decoupled from the fuse reference voltage in the second fuse state.

10. The software programmable fuse cell of claim 9 wherein the fuse reference and software fuse reference voltages comprise ground.

11. The software programmable fuse cell of claim 10 wherein the initialization reference voltage comprises ground.

12. The software programmable fuse cell of claim 2 further comprises output stage coupled between the latch and the fuse cell output terminal to stabilize the fuse output signal.

13. The software programmable fuse cell of claim 2 wherein input terminals comprise first, second, third, and fourth input terminals for receiving first, second, third and fourth input signals.

14. The software programmable fuse cell of claim 1 wherein:

the software programmable fuse circuit comprises a software fuse reference voltage; and the fuse circuit comprises a fuse reference voltage, the fuse is coupled to the fuse reference voltage in the first fuse state and decoupled from the fuse reference voltage in the second fuse state.

15. The software programmable fuse cell of claim 14 wherein the fuse reference and software fuse reference voltages comprise ground.

16. The software programmable fuse cell of claim 1 further comprises output stage coupled between the latch and the fuse cell output terminal to stabilize the fuse output signal.

17. The software programmable fuse cell of claim 1 wherein input terminals comprise first, second, third, and fourth input terminals for receiving first, second, third and fourth input signals.

18. The software programmable fuse cell of any one of claims 2–13 wherein:

in the initialization mode, the control circuit couples the initialization circuit to the latch and decouples the fuse and software programmable fuse circuit form the latch;

in the first mode, the control circuit couples the fuse circuit to the latch and decouples the initialization and software fuse circuits from the latch; and in the second mode, to simulate the first fuse state, the initialization circuit is decoupled from the latch and the software programmable fuse circuit is coupled to the latch, and to simulate the second fuse state, the fuse and software programmable fuse circuits are decoupled from the latch and the initialization circuit is coupled to the latch.

19. The software programmable fuse cell of claim 18 wherein the control circuit comprises first, second and third switches, the first switch selectively coupling the initialization circuit to the latch, the second switch selectively coupling the fuse circuit to the latch, and the third switch selectively coupling the software programmable fuse circuit to the latch.

20. The software programmable fuse cell of claim 19 wherein the control circuit further comprises:

an initialization control block having an output terminal coupled to the first switch to control the first switch;

a fuse control block having an output terminal coupled to the second switch to control the second switch; and a software fuse control block having an output terminal coupled to the third switch to control the third switch.

21. A software programmable fuse cell comprising:

fuse cell input terminals for receiving fuse input control signals;

a cell fuse output terminal;

a control circuit coupled to the input terminals, the control circuit includes an initialization circuit;

a fuse circuit coupled to the control circuit, the fuse circuit comprises a fuse having a first or a second fuse state;

a software programmable fuse circuit coupled to the control circuit;

a latch coupled to the fuse output terminal and the control circuit, the latch having a first or a second latch state causing the fuse output signal at the fuse cell output terminal to have a first or second output state, the first or second output state indicative of the fuse having either the first or second fuse state; and in response to the input signals at the input terminals, the control circuit causes the fuse cell to be in an initialization, first or second mode of the fuse cell operation, wherein in the initialization mode, the control circuit couples the initialization circuit to the latch to initialize the latch to the first latch state, in the first mode, the control circuit couples the fuse circuit to the latch, causing the latch to be in one of the first or second latch state depending on the fuse state; and in the second mode, the control circuit and the software programmable fuse circuit cause the latch to be in the first or second state depending on the input signals.

* * * * *